US005518861A

United States Patent [19]

Coveleskie et al.

[11] Patent Number: 5,518,861

[45] Date of Patent: May 21, 1996

[54] ELEMENT AND PROCESS FOR LASER-INDUCED ABLATIVE TRANSFER

[75] Inventors: Richard A. Coveleskie; Harvey W. Taylor, both of Sayre; Gregory C. Weed, Towanda, all of Pa.

[73] Assignee: E. I. Du Pont de Nemours and Company, Wilmington, Del.

[21] Appl. No.: 233,198

[22] Filed: Apr. 26, 1994

[51] Int. Cl.[6] .......... G03F 7/34

[52] U.S. Cl. .......... 430/200; 430/252; 430/253; 430/945

[58] Field of Search .......... 430/200, 252, 430/253, 945

[56] References Cited

U.S. PATENT DOCUMENTS

| | | | |
|---|---|---|---|
| 4,541,830 | 9/1985 | Hotta et al. | 8/471 |
| 4,643,917 | 2/1987 | Koshizuka et al. | 427/256 |
| 4,772,582 | 9/1988 | DeBoer | 503/227 |
| 4,942,141 | 7/1990 | DeBoer | 503/227 |
| 4,948,776 | 8/1990 | Evans et al. | 503/227 |
| 5,019,549 | 5/1991 | Kellogg et al. | 503/227 |
| 5,156,938 | 10/1992 | Foley et al. | 430/200 |
| 5,171,650 | 12/1992 | Ellis et al. | 430/20 |
| 5,254,524 | 10/1993 | Guittard et al. | 503/227 |

FOREIGN PATENT DOCUMENTS

| | | |
|---|---|---|
| 0439049A1 | 7/1991 | European Pat. Off. . |
| 0453579A1 | 10/1991 | European Pat. Off. . |
| 0575959A1 | 12/1993 | European Pat. Off. . |
| 2083726 | 3/1982 | United Kingdom . |

*Primary Examiner*—Charles L. Bowers, Jr.
*Assistant Examiner*—Christopher G. Young

[57] ABSTRACT

An element and process of use in a laser-induced ablative transfer process, said element comprising (a) a support having a first surface, said first surface having a surface roughness with an $R_z$ value of r, and bearing on the first surface (b) at least one transfer coating comprising (i) a non-sublimable imageable component (ii) a laser-radiation absorbing component, and (iii) optionally a binder, wherein the imageable component and the laser-radiation absorbing component can be the same or different; wherein the transfer coating and any additional coating on the first surface of the support have a total thickness t; and further where $r \geqq 1.5t$ is described.

16 Claims, No Drawings

ELEMENT AND PROCESS FOR LASER-INDUCED ABLATIVE TRANSFER

FIELD OF THIS INVENTION

This invention relates to an element and process for laser-induced thermal transfer. More particularly, this invention relates to (a) a donor element comprising a support having a surface roughness r and at least one transfer coating provided thereon having a total thickness t wherein r≧1.5t and (b) a receiver element wherein upon exposing imagewise the donor or receiver element to laser radiation, a portion of the donor element is transferred to the receiver element and upon separation, an image having enhanced solid uniformity is obtained.

BACKGROUND OF THE INVENTION

Laser-induced thermal transfer processes are well-known in applications such as color proofing and lithography. Such laser-induced processes include, for example, dye sublimation, dye transfer, melt transfer, and ablative material transfer. These processes have been described in, for example, Baldock, UK Patent 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element that contains the imageable component, i.e., the material to be transferred, and (b) a receiver element. The donor element is imagewise exposed by a laser, usually an infrared laser, resulting in transfer of material to the receiver element. The exposure takes place only in a small, selected region of the donor at one time, so that the transfer can be built up one pixel at a time. Computer control produces transfer with high resolution and at high speed.

For the preparation of images for proofing applications, the imageable component is a colorant. For the preparation of lithographic printing plates, the imageable component is an oleophilic material which will receive and transfer ink in printing.

Laser-induced processes are fast and result in transfer of material with high resolution. However, in many cases, the resulting solid image uniformity is poor. Large solid images have a mottled or striated appearance which is generally unacceptable in proofing applications and in printing. It has been disclosed by Hotta et al., U.S. Pat. No. 4,541,830, and DeBoer, U.S. Pat. No. 4,772,582, that solid image uniformity in dye sublimation processes can be improved by the inclusion of nonsublimable particles in the dye layer or in a separate layer. However, the inclusion of nonsublimable particles in the receiver element can affect transfer density and image quality. It has been disclosed by Guittard et al., U.S. Pat. No. 5,254,524, transfer density can be improved in a dye sublimation process by utilizing a textured polymeric layer on the surface of either the donor element or the receiver element.

However, a dye sublimation process is quite different from a laser ablative transfer process. In a dye sublimation process, transferred via condensation on the receiver surface. In an ablative transfer process, a non-sublimable imageable component is transferred as a solid material by an explosive force onto the receiver elment. The mechanisms by which the transfer is effected are very different in the two processes. Factors which improve transfer in one process will not necessarily be applicable in the other process.

SUMMARY OF THE INVENTION

This invention provides a donor element for use in a laser-induced ablative transfer process, said donor element comprising:

(a) a support having a first surface, said first surface having a surface roughness with an $R_z$ value of r, and bearing on the first surface (b) at least one transfer coating comprising:

(i) a non-sublimable imageable component, (ii) a laser-radiation absorbing component, and (iii) optionally, a binder, wherein the imageable component and the laser-radiation absorbing component can be the same or different; wherein the transfer coating and any additional coating on the first surface of the support have a total thickness t; and further wherein r≧1.5t.

In a second embodiment this invention concerns a laser-induced ablative transfer process comprising:

(1) imagewise exposing to laser radiation a laserable assemblage comprising:

(A) a donor element having (a) a support having a first surface, said first surface having a surface roughness with an $R_z$ value of r, and bearing on the first surface, (b) at least one coating comprising:

(i) a non-sublimable imageable component, (ii) a laser-radiation absorbing component, and (iii) optionally, a binder, wherein the imageable component and the laser-radiation absorbing component can be the same or different; wherein coatings on the first surface of the support have a total thickness t; and further wherein r≧1.5t and (B) a receiver element situated proximally to the first surface of the donor element, wherein a substantial portion of the imageable component (i) is transferred to the receiver element by laser-induced thermal transfer; and (2) separating the donor element from the receiver element.

Steps (1)–(2) can be repeated at least once using the same receiver element and a different donor element having a non-sublimable imageable component the same as or different from the first imageable component.

DETAILED DESCRIPTION OF THE INVENTION

This invention concerns a process for laser-induced thermal transfer, and an element for use in such a process, which provides good density transfer of the imageable component onto the receiver element with good solid image uniformity. By "solid image uniformity" it is meant that the material that is transferred has an unvaried or uniform appearance in areas having a solid pattern or color. The present invention achieves solid image uniformity in applications for color proofs, lithographic printing plates, and other applications. The element comprises a transfer coating on a support having a surface roughness $R_z$=r, where r is at least 1.5 times as great as the total thickness of all the coatings on that side of the support.

Donor Element

The donor element comprises a support having a roughened surface, and bearing on that surface at least one coating which is a transfer coating comprising (i) a non-sublimable imageable component, (ii) a laser-radiation absorbing component, and (iii) optionally, a binder. The imageable component and the laser-radiation absorbing component can be the same or different. The transfer coating can consist of a single layer, or multiple layers, having components (i)–(iii).

1. Support

The donor support is a dimensionally stable sheet material having a surface roughness indicated by an $R_z$ value of r. The term "surface roughness" is intended to mean the microscopic peak-to-valley distances of film-surface protuberances and depressions. The term "$R_z$" is the average height difference between the five highest and the five lowest valleys over a 1 cm length, as measured by a stylus instrument. When the laserable assemblage is to be imaged through the donor support, the support should also be capable of transmitting the laser radiation, and not be adversely affected by this radiation. Examples of suitable support materials include, for example, polyesters, such as polyethylene terephthalate and polyethylene naphthanate; polyamides; polycarbonates; fluoropolymers; polyacetals; polyolefins; etc. A preferred support material is polyethylene terephthalate film.

The surface roughness can be achieved in any number of ways, which are well known in the art. For example, suitable surface roughness can be obtained by the inclusion into the support film of particulate material having a large enough particle size to protrude through the film surface. Examples of such films include filled polyester films such as Melinex® 376, 377, 378 and 383 (ICI, Wilmington, Del.), and Mylar® EB11 (E. I. du Pont de Nemours and Company, Wilmington Del.).

Surface roughness can also be obtained by embossing. In general, embossing can be accomplished by laminating a smooth support film to a second material having surface irregulaties. The donor support film conforms to the surface to which it is laminated, thus creating peaks and valleys which are the mirror image of those in the second material. The embossing step can take place either before or after the transfer coating is applied to the donor support. Suitable second materials for embossing include etched metals, matte films such as polyethylene, ceramic materials, etc.

Other methods for obtaining surface roughness include surface treatments, such as sand blasting and chemical etching, and process treatments, such as the acceleration of crystallization of melt extruded films or solvent coating techniques.

The surface roughness should have an $R_z$ value at least 1.5 times larger than the total thickness of all the coatings on the roughened surface, preferably at least three times larger, most preferably 5 to 10 times larger. In general, improved solid density uniformity in the transferred material is achieved with donor supports having an $R_z$ value of at least 1 micrometer, preferably at least 1.5 micrometers, most preferably 2.5 to 5 micrometers.

The donor support can have a roughened surface on both sides. However, if the laser imaging is to take place through the donor support, a second roughened surface can cause light scattering which is detrimental to image resolution. Therefore, it is usually preferred that the donor support have only one roughened surface, to which the transfer coating is applied.

The donor support typically has a thickness of about 5 to about 250 micrometers, and can have a subbing layer, if desired. A preferred thickness is about 10 to 50 micrometers.

2. Transfer Coating

The transfer coating comprises (i) a non-sublimable imageable component, (ii) a laser-radiation absorbing component, and (iii) optionally, a binder.

The nature of the imageable component will depend on the intended application for the assemblage and on the nature of the thermal transfer process. For example, for imaging applications, the imageable component will be a colorant. The colorant can be a pigment or a dye.

For most laser-induced thermal imaging processes, it is preferred to use a pigment as the colorant because pigments are more stable and provide greater color density. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7).

Combinations of pigments and/or dyes can also be used.

In accordance with principles well known to those skilled in the art, the concentration of colorant will be chosen to achieve the optical density desired in the final image. The amount of colorant will depend on the thickness of the transfer coating and the absorption of the colorant.

A dispersant is usually present when a pigment is to be transferred, in order to achieve maximum color strength, transparency and gloss. The dispersant, generally an organic polymeric compound, is used to disperse the fine pigment particles and avoid flocculation and agglomeration. A wide range of dispersants is commercially available. A dispersant is selected according to the characteristics of the pigment surface and other components in the composition as practiced by those skilled in the art. However, dispersants suitable for practicing the invention are the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in "Use of AB Block Polymers as Dispersants for Non-aqueous Coating Systems", by H. C. Jakubauskas, Journal of Coating Technology, Vol. 58, No. 736, pages 71–82. Suitable AB dispersants are also disclosed in U.K. Patent 1,339,930 and U.S. Pat. Nos. 3,684,771; 3,788,996; 4,070,388; 4,912,019; and 4,032,698. Conventional pigment dispersing techniques, such as ball milling, sand milling, etc., can be employed.

For lithographic applications, the imageable component is an oleophilic, ink-receptive material. The oleophilic material is usually a film-forming polymeric material. Examples of suitable oleophilic materials include polymers and copolymers of acrylates and methacrylates; polyolefins; polyurethanes; polyesters; polyaramids; epoxy resins; novolak resins; and combinations thereof. Preferred oleophilic materials are acrylic polymers.

In lithographic applications, a colorant can also be present. The colorant facilitates inspection of the plate after it is made. Any of the colorants discussed above can be used.

The colorant can be a heat-, light-, or acid-sensitive color former. The colorant can be in a layer that is the same as or different from the layer containing the oleophilic material.

In general, for both color proofing and lithographic printing applications, the imageable component is present in an amount of from about 35 to 95% by weight, based on the total weight of the transfer coating. For color proofing applications, the amount of imageable component is preferably about 45–65% by weight; and for lithographic printing applications, preferably about 65–85% by weight.

Although the above discussion is limited to color proofing and lithographic printing applications, the element and process of the invention apply equally to the transfer of other types of imageable components in different applications. In general, the scope of the invention in intended to include any application in which solid material is to be applied to a receptor in a pattern. Examples of other suitable imageable components include, but are not limited to, magnetic materials, fluorescent materials, and electrically conducting materials.

The imageable component can also function as a laser radiation absorbing component, however, in most cases it is desirable to have a separate laser radiation absorbing component included in the donor element. The component can comprise finely divided particles of metals such as aluminum, copper or zinc, or one of the dark inorganic pigments, such as carbon black or graphite. However, the component is preferably an infrared absorbing dye. Suitable dyes which can be used alone or in combination include poly(substituted)phthalocyanine compounds and metal-containing phthalocyanine compounds; cyanine dyes; squarylium dyes; chalcogenopyryloarylidene dyes; croconium dyes; metal thiolate dyes; bis(chalcogenopyrylo)polymethine dyes; indene-bridged polymethine dyes; oxyindolizine dyes; bis(aminoaryl)polymethine dyes; merocyanine dyes; and quinoid dyes. Infrared-absorbing materials for laser-induced thermal imaging have been disclosed, for example, by Barlow, U.S. Pat. No. 4,778,128; DeBoer, U.S. Pat. Nos. 4,942,141, 4,948,778, and 4,950,639; Kellogg, U.S. Pat. No. 5,019,549; Evans, U.S. Pat. Nos. 4,948,776 and 4,948,777; and Chapman, U.S. Pat. No. 4,952,552.

When present, the laser-radiation absorbing component generally has a concentration of about 1 to 15% by weight, based on the total weight of the transfer coating; and preferably 5–10% by weight. Absorptions of the desired wavelength typically range from about 0.5 to 2.5.

Other ingredients, for example, binders, surfactants, coating aids and plasticizers, can be present in the transfer coating, provided that they are compatible with the other ingredients and do not adversely affect the properties of the assemblage in the practice of the process of the invention. For color proofing applications, the additives should not impart unwanted color to the image. For lithographic printing applications, the additives should not adversely affect the oleophilic properties of the transferred material.

In most lithographic printing applications, the imageable component, i.e., oleophilic material, functions as a binder and no additional binder is needed. In some cases ethylenically unsaturated monomers or oligomers and photo- or thermal initiators are also present. These can be photo- or thermally crosslinked subsequent to transfer to increase the durability of the oleophilic surface.

For color proofing and other applications, a binder is generally added as a vehicle for the imageable component and to give the coating integrity. The binder is generally a polymeric material. It should be of sufficiently high molecular weight so that it is film-forming, yet of sufficiently low molecular weight so that it is soluble in the coating solvent. The binder can be self-oxidizing or nonself-oxidizing. Examples of suitable binders include, but are not limited to cellulose derivatives, such as, cellulose acetate, cellulose triacetate, cellulose acetate butyrate, cellulose acetate propionate, cellulose acetate hydrogen phthalate, nitrocellulose; polyacetals, such as polyvinyl butyral; acrylate and methacrylate polymers and copolymers; acrylic and methacrylic acid polymers and copolymers; polycarbonate; copolymers of styrene and acrylonitrile; polysulfones; polyurethanes; polyesters; polyorthoesters; and poly(phenylene oxide).

The binder, when present, generally has a concentration of about 15–50% by weight, based on the total weight of the transfer coating, preferably 30–40% by weight.

Plasticizers are well known and numerous examples can be found in the art. These include, for example, acetate esters of glycerine; polyesters of phthalic, adipic and benzoic acids; ethoxylated alcohols and phenols; and the like. Monomers and low molecular weight oligomers can also be used.

It is preferred that the composition for the transfer coating be contained in a single layer. However, the composition can also be contained in multiple layers coated on the same side of the support. The imageable component and laser radiation absorbing component can be in separate layers, or variously combined into two or more layers. Each of these layers can have a binder, the binders for each layer being the same or different. In general, the layer containing the imageable component will be outermost from the support.

The layer(s) can be coated onto the donor support as a dispersion in a suitable solvent. Any suitable solvent can be used as a coating solvent, as long as it does not deleteriously affect the properties of the assemblage, using conventional coating techniques or printing techniques, for example, gravure printing.

The donor element can have additional layers as well. An antihalation layer can be coated on the side of the support opposite the transfer coating. Materials which can be used as antihalation agents are well known in the art. The donor element can have a laser radiation-absorbing intermediate layer between the support and the transfer coating layer(s). Suitable intermediate layers have been described in Ellis et al., U.S. Pat. No. 5,171,650, including low melting thin metal films.

As discussed above, the total thickness of all the coatings on the first surface of the support (i.e., the layer(s) which comprise the transfer coating plus any additional layers on that side of the support) is t. The relationship between the total coating thickness and the surface roughness of the support is $r \geqq 1.5t$.

Receiver Element

2. Receiver Element

The receiver element typically comprises a receptor support and, optionally, an image-receiving layer. The receptor support comprises a dimensionally stable sheet material. The assemblage can be imaged through the receptor support if that support is transparent. Examples of transparent films include, for example polyethylene terephthalate, polyether sulfone, a polyimide, a poly(vinyl alcohol-co-acetal), or a cellulose ester, such as cellulose acetate. Examples of opaque supports materials include, for example, polyethylene terephthalate filled with a white pigment such as titanium dioxide, ivory paper, or synthetic paper, such as Tyvek® spunbonded polyolefin. Paper supports are preferred for proofing applications. For lithographic printing applications, the support is typically a thin sheet of aluminum, such as anodized aluminum, or polyester.

Although the imageable component can be transferred directly to the receptor support, the receiver element typically can have an additional receiving layer on one surface thereof. For image formation applications, the receiving layer can be a coating of, for example, a polycarbonate, a polyurethane, a polyester, polvinyl chloride, styrene/acrylonitrile copolymer, poly(caprolactone), and mixtures thereof. This image receiving layer can be present in any amount effective for the intended purpose. In general, good results have been obtained at coating weights of 0.5–4.2 micrometers. For lithographic applications, typically the aluminum sheet is treated to form a layer of anodized aluminum on the surface as a receptor layer. Such treatments are well known in the lithographic art.

It is also possible that the receiver element is not the final intended support for the imageable component. In other words, the receiver element can be an intermediate element and the laser imaging step can be followed by one or more transfer steps by which the imageable component is transferred to the final support. This is most likely applicable to multicolor proofing applications in which a multicolored image is built up on the receiver element and then transferred to a permanent paper support.

Process Steps

1. Exposure

The first step in the process of the invention is imagewise exposing the laserable assemblage to laser radiation. The laserable assemblage comprises the donor element and the receiver element, described above.

The assemblage is prepared by placing the donor and receiver elements in contact together such that the side bearing the transfer coating is touching the receiver element or the receiving layer on the receiver element. Significant vacuum or pressure should not be used to hold the two elements together. In some cases, the adhesive properties of the receiver and donor elements alone is sufficient to hold the elements together. Alternatively, the donor and receiver elements can be taped together and taped to the imaging apparatus. A pin/clamping system can also be used. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm. Diode lasers offer substantial advantages such as their small size, low cost, stability, reliability, ruggedness and ease of modulation. Diode lasers emitting in the range of 800 to 830 nm are most preferred. Such lasers are available from, for example, Spectra Diode Laboratories (San Jose, Calif.).

The exposure can take place through the support of the donor element or through the receiver element, provided that these are substantially transparent to the laser radiation. In most cases, the donor support will be a film which is transparent to infrared radiation and the exposure is conveniently carried out through the support. However, if the receiver element is substantially transparent to infrared radiation, the process of the invention can also be carried out by imagewise exposing the receiver element to infrared laser radiation.

The laserable assemblage is exposed imagewise so that the imageable component is transferred to the receiver element in a pattern. The pattern itself can be, for example, in the form of dots or linework generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect of each other, such that each minute area of the assemblage, i.e., "pixel" is individually addressed by the laser. This is generally accomplished by mounting the laserable assemblage on a rotatable drum. A flat bed recorder can also be used.

2. Separation

The next step in the process of the invention is separating the donor element from the receiver element. Usually this is done by simply peeling the two elements apart. This generally requires very little peel force, and is accomplished by simply separating the donor support from the receiver element. This can be done using any conventional separation techniques and can be manual or automatic without operator intervention.

| Glossary | |
|---|---|
| Binder 1 | Elvacite ® 2044, polybutylmethacrylate, E. I. du Pont de Nemours and Company (Wilmington, DE) |
| Binder 2 | Vinac B-15, polyvinyl acetate, Air Products (Allentown, PA) |
| Binder 3 | Elvax 40W, polymethylene/polyvinyl acetate, E. I. du Pont de Nemours and Company (Wilmington, DE) |
| Binder 4 | Binder and oleophilic material, poly(methylmethacrylate/ethylacrylate/methacrylic acid), (44/35/21) $M_w$ = 50,000 MW |
| Black 1 | Mixture of Raven 450/Raven 1035, 50:50 Cities Service (Akron, OH) |
| Cyan 1 | Cyan pigment, Heliogen ® Blue L6930 BASF (Clifton, NJ) with Dispersant 1 (1.8:1), 33.3% solids in butyl acetate |
| Cyan 2 | Cyan pigment, Heubach Heucopthal ® Blue G, Cookson Pigments, (Newark, NJ) with Dispersant 1 (1:1), 33.2% solids in butyl acetate |
| Cyan 3 | Cyan pigment, Heubach Heucopthal ® Blue G, Cookson Pigments (Newark, NJ) |
| Dispersant 1 | AB dispersant |
| Dispersant 2 | AB dispersant |
| Dispersant 3 | Poly(alpha-methylstyrene) |
| FC 430 | Fluorinated surfactant, 3M (Minneapolis, MN) |
| Initiator | 2-Phenyl-2,2'-dimethoxyacetophenone |
| Magenta 1 | Magenta pigment, Quindo Magenta RV 6803, Harmon Colors (Hawthorne, NJ) with Dispersant 1 (1:1), 26.9% solids in ethyl acetate |
| Magenta 2 | Magenta pigment, Hoechst Permanent Rubine Red F6B Hoechst Celanese (Somerville, NJ) with Dispersant 1 |
| MEK | Methyl ethyl ketone |
| Pluronic | Pluronic 32R1, surfactant from BASF (Parsippany, NJ) |
| SQS | 4-[3-[2,6-Bis(1,10-dimethylethyl)-4H-thiopyran-4-ylidene]methyl]-2-hydroxy-4-oxo-2-cyclobuten-1-ylidene]methyl-2,6-bis(1,1-diethylethyl)thiopyrilium hydroxide, inner salt, 2.3% solution in toluene |
| TMPEOTA | Ethoxylated trimethylolpropane triacrylate |
| TMPTMA | Trimethylolpropane triacrylate |
| Yellow 1 | Yellow pigment, Cromophthal ® Yellow 3G, Ciba Geigy (Ardsley, NY) with Dispersant 1 (1:1), 28.2% solids in butyl acetate |

-continued

| Glossary | |
|---|---|
| Yellow 2 | Yellow pigment, Hoechst Permanent Yellow GG, Hoechst Celanese (Somerville, NJ) |

In the examples which follow, "coating solution" refers to the mixture of solvent and additives which is coated on the support. The term encompasses both true solutions and dispersions. Amounts are expressed in parts by weight, unless otherwise specified.

General Procedure

The surface roughness was measured using a Talysurf 5M instrument. The film sample was prepared on a special holder using a perfectly smooth cylinder. The surface was analyzed by the Talysurf 5M by drawing a diamond stylus across the film surface. The asperities detected by the stylus were magnified 20,000 to 100,000 times and graphed on an analog chart recorder. The analog data was converted to a digital signal and the $R_z$ parameter was measured. The $R_z$ was measured in both the transverse and machine direction. The value used was the average of these two.

The components of the coating solution were combined in an amber glass bottle and rolled overnight to ensure complete mixing. When a pigment was used as the colorant, it was first mixed with the dispersant in a solvent on an attritor with steel balls for approximately 20 hours, and then added to the remaining transfer coating composition. The mixed solution was then coated onto a 4 mil (0.010 cm) thick sheet of Mylar® polyester film (E. I. du Pont de Nemours and Company, Wilmington, Del.). The coating was air dried to form a donor element having a transfer coating with a dry thickness in the range from 0.3 to 2.0 micrometers depending on percent solids of the formulation and the blade used to coat the formulation onto the film.

System testing was performed on two types of laser imaging apparatuses. The first apparatus was a single diode laser coupled to a precision lathe which was mounted on a lathe toolrest. The laser power was 100 mW at 818 nm, which delivered 76.5 mW to the image plane. The lathe had a 5-inch (12.7 cm) diameter drum. A 10× microscope objective focussed the laser light to an elliptical spot of 21×13 micrometers ($1/e^2$ diameter), which corresponded to an average power density of $3\times10^7$ mW/cm$^2$. The amount of energy was controlled by varying the lathe rpm and adjusting the toolrest speed to obtain a 10 micrometer overlap of exposures. Exposure rpm's of 100, 200, and 300 correspond to area exposure energies of 1140, 570, and 380 mj/cm$^2$, respectively.

The second imaging apparatus was a Crosfield Magnascan 646 (Crosfield Electronics, Ltd., London, England) which had been retrofitted with a CREO writehead (Creo Corp., Vancouver, BC) using an array of 36 infrared lasers emitting at 830 nm (SDL-7032-102 from Sanyo Semiconductor, Allendale, N.J.).

The receptor element was first taped to the drum of a laser imaging apparatus. The donor element was then laid over the receptor with the transfer coating facing the receptor, pulled tight, and also taped in place. The film was then exposed over a 1–2 cm area at varying rpms to transfer the imageable component to the receptor.

After laser imaging, the tape was removed and the donor element was separated from the receiver element.

Solid image uniformity of the imaged receiver element was then evaluated visually and rated according to the following scale:

0=excellent, no mottle
1=good, slight mottle
2=fair, moderate mottle
3=poor, considerable mottle Examples 1–6 illustrate the use of elements of the invention in a laser ablation transfer process for a color proofing application.

EXAMPLE 1

The following coating solutions were prepared as a 39% solids disperion in toluene:

| Component | % Total Solids |
|---|---|
| Cyan 1 | 81.6 |
| SQS | 10.0 |
| Binder 1 | 8.3 |
| FC 430 | 0.1 |

The coating solution was coated onto the donor support with a No. 3 wire wound rod to a dry thickness of 0.4–0.5 μ to form a donor element.

For Control 1, the donor support was 92D Mylar®, having an $R_z$ value of about 0.1 μ.

For Sample 1, the donor support was Melinex® 383, having an $R_z$ value of 3.69 μ, on the matte side. The coating solution was coated onto the matte side of the Melinex® film.

The receptor was LOE (Lustro Gloss, manufactured by Warner Paper, Westbrook, Me.) paper.

The sample and the control were tested on the first, single diode laser apparatus. The resulting solid image uniformity was rated as follows:

| | |
|---|---|
| Control 1 | rating = 3 |
| Sample 1 | rating = 0 |

This clearly shows the superior performance of the element and process of the invention.

EXAMPLES 2–4

Example 1 was repeated using Melinex® 383 having the $R_z$ value given in Example 1 as the donor support with the following coating solutions:

| | % Total Solids | | |
|---|---|---|---|
| Component | Sample 2 | Sample 3 | Sample 4 |
| Cyan 1 | 64.9 | | |
| Magenta 1 | | 64.9 | |
| Yellow 1 | | | 64.9 |
| SQS | 10.0 | 10.0 | 10.0 |
| Binder 1 | 7.2 | 7.2 | 7.2 |
| FC 430 | 0.1 | 0.1 | 0.1 |
| Pluronic | 17.8 | 17.8 | 17.8 |

The image uniformity was rated as 0 for Samples 2–4.

EXAMPLE 5

The following coating solutions were prepared as a 10% solids disperion in 14% MEK, 28% butyl acetate, 58% toluene:

| | % Total Solids | | |
|---|---|---|---|
| Component | A | B | C |
| Cyan 2 | 34 | | |
| Magenta 1 | | 44 | 80 |
| SQS | 5 | 5 | 5 |
| Binder 1 | 60 | | |
| Binder 2 | | 51 | |
| Binder 3 | | | 9 |
| Pluronic | | | 8 |

The coating solution was coated onto a donor support with a No. 3 wire wound rod to a thickness of 0.5–0.6 μ, to form a donor element.

For Control 5A, Control 5B and Control 5C, the donor support was 92D Mylar®, having the $R_z$ value given in Example 1.

For Sample 5A, Sample 5B and Sample 5C, the donor support was Melinex® 383, having the $R_z$ value given in Example 1. The coating solution was coated onto the matte side of the Melinex® film.

The receptor was LOE paper.

The samples and controls were imaged as in Example 1. The resulting solid image uniformity was rated as follows:

| Film | Rating |
|---|---|
| Control 5A | 2–3 |
| Control 5B | 2–3 |
| Control 5C | 2–3 |
| Sample 5A | 0–1 |
| Sample 5B | 0–1 |
| Sample 5C | 0–1 |

EXAMPLE 6

The following coating solutions were prepared as an 8% solids disperion in 50% MEK, 20% methyl propyl ketone, 15% N-butyl acetate, 15% cyclohexanone:

| | % Total Solids | | |
|---|---|---|---|
| Component | A | B | C |
| Cyan 3 | 62 | | |
| Magenta 2 | | 63 | |
| Yellow 2 | | | 63 |
| Dispersant 2 | 33 | | 32 |
| Dispersant 3 | | 32 | |
| SQS | 5 | 5 | 5 |

The coating solutions were prepared in a ball mill and coated onto the donor support with a No. 3 wire wound rod to a thickness of 0.4–0.5 μ, to form a donor element.

For Control 6A, Control 6B and Control 6C, the donor support was 92D Mylar®, having the $R_z$ value given in Example 1.

For Sample 6A, Sample 6B and Sample 6C, the donor support was Melinex® 383, having the $R_z$ value given in Example 1. The coating solution was coated onto the matte side of the Melinex® film.

The receptor was LOE paper.

The samples and controls were imaged as in Example 1. The resulting solid image uniformity was rated as follows:

| Film | Rating |
|---|---|
| Control 6A | 2–3 |
| Control 6B | 2–3 |
| Control 6C | 2–3 |
| Sample 6A | 0–1 |
| Sample 6B | 0–1 |
| Sample 6C | 0–1 |

EXAMPLE 7

This example illustrates the element used in the process of the invention in which the surface irregularities in the donor support are created after the transfer layer is coated onto the support.

The following coating solutions were prepared as 15% solids dispersion in a solvent mixture of 70% MEK, 15% n-butyl acetate, 15% cyclohexanone:

| Component | % Total Solids |
|---|---|
| Binder 4 | 53.31 |
| SQS | 8.00 |
| TMPEOTA | 23.92 |
| TMPTA | 4.77 |
| Initiator | 10.00 |

The solution was coated onto 200D Mylar® using a No. 5 wire wound rod at a 1.5 μ coating weight. One element was used as Control 7. Matte polyethylene having an $R_z$ value of 8.1 μ (Treadegar, Terra Haute, Ind.), was overlaid on the transfer coating and allowed to conform to the surface coating of the film used as Sample 7. The matte polyethylene was removed prior to exposure.

The receiver element was a sheet of grained and anodized aluminum, Imperial Type DE (Imperial Metal and Chemical Co., Philadelphia, Pa.).

The second, Crosfield, apparatus was used for imaging with a fluence level of about 600 mJ/cm$^2$ in the overlap mode, using both 50% and 100% dot patterns.

With Control 7, there was incomplete transfer for 50% and 100% dots.

With Sample 7, there was complete image transfer for both 50% and 100% dots.

What is claimed is:

1. An element for use in a laser-induced ablative transfer process, said element comprising:

(a) a support having a first surface, said first surface having a surface roughness with an $R_z$ value of r, and bearing on the first surface (b) at least one transfer coating comprising:

(i) a non-sublimable imageable component, (ii) a laser-radiation absorbing component, and wherein the imageable component and the laser-radiation absorbing component can be the same or different, wherein the transfer coating and any other coatings on the first surface of the support have a total thickness t, and further wherein $r \geqq 1.5t$.

2. The element of claim 1 wherein the transfer coating comprises a single layer.

3. The element of claim 1 wherein the imageable component comprises an oleophilic material and the transfer coating comprises:

(i) 50–95% by weight imageable component, based on the total weight of the transfer coating; and (ii) 1–15% by weight laser-radiation absorbing component, based on the total weight of the transfer coating.

4. The element of claim 1 wherein r is at least 1.0 micrometer.

5. The element of claim 1 wherein the transfer coating further comprises a binder.

6. The element of claim 5 wherein the transfer coating comprises:

(i) 35–95% by weight imageable component, based on the total weight of the transfer coating;

(ii) 1–15% by weight laser-radiation absorbing component, based on the total weight of the transfer coating; and (iii) 0–50% by weight binder, based on the total weight of the transfer coating.

7. The element of claim 5 wherein the imageable component comprises a pigment and the transfer coating comprises:

(i) 35–65% by weight imageable component, based on the total weight of the transfer coating;

(ii) 1–15% by weight laser-radiation absorbing component, based on the total weight of the transfer coating; and (iii) 15–50% by weight binder, based on the total weight of the transfer coating.

8. A laser-induced ablative transfer process which comprises:

(1) imagewise exposing to laser radiation a laserable assemblage comprising:

(A) a donor element comprising (a) a support having a first surface, said first surface having a surface roughness with an $R_z$ value of r, and bearing on the first surface, (b) a transfer coating comprising:

(i) a non-sublimable imageable component, (ii) a laser-radiation absorbing component, and wherein the imageable component and the laser-radiation absorbing component can be the same or different; wherein the transfer coating and any additional coatings on the first surface of the support have a total thickness t; and further wherein $r \geqq 1.5t$; and (B) a receiver element situated proximally to the first surface of the donor element, wherein a substantial portion of the imageable component (i) is transferred to the receiver element by laser-induced ablative transfer; and (2) separating the donor element from the receiver element.

9. The process of claim 8 wherein the transfer coating comprises a single layer.

10. The process of claim 8 wherein the transfer coating thickness is in the range from 0.5 to 1.0 micrometers and the $R_z$ value is at least 1.5 micrometer.

11. The process of claim 8 wherein the imageable component is an oleophilic material and the transfer coating comprises:

(i) 35–95% by weight imageable component, based on the total weight of the transfer coating; and (ii) 1–10% by weight laser-radiation absorbing component, based on the total weight of the transfer coating.

12. The process of claim 11 wherein the receiver element is anodized aluminum.

13. The process of claim 8 wherein the transfer coating further comprises a binder.

14. The process of claim 13 wherein the imageable component is a colorant and the transfer coating comprises:

(i) 35–65% by weight imageable component, based on the total weight of the transfer coating;

(ii) 1–10% by weight laser-radiation absorbing component, based on the total weight of the transfer coating; and (iii) 5–50% by weight binder, based on the total weight of the transfer coating.

15. The process of claim 14 wherein steps (1)–(2) are repeated at least once using the same receiver element and a different donor element having a colorant the same as or different from the first colorant.

16. The process of claim 14 wherein the receiver element is paper.

* * * * *